United States Patent
Takakusagi

(10) Patent No.: US 9,357,186 B2
(45) Date of Patent: May 31, 2016

(54) SOLID-STATE IMAGING APPARATUS AND CAMERA

(71) Applicant: CANON KABUSHIKI KAISHA, Tokyo (JP)

(72) Inventor: Hiroshi Takakusagi, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 14/243,007

(22) Filed: Apr. 2, 2014

(65) Prior Publication Data

US 2014/0327798 A1 Nov. 6, 2014

(30) Foreign Application Priority Data

May 2, 2013 (JP) .................................. 2013-097112

(51) Int. Cl.
 *H04N 9/04* (2006.01)
 *H04N 5/369* (2011.01)
 *H01L 27/146* (2006.01)

(52) U.S. Cl.
 CPC .......... *H04N 9/045* (2013.01); *H01L 27/14621* (2013.01); *H01L 27/14623* (2013.01); *H01L 27/14685* (2013.01); *H04N 5/3696* (2013.01); *H01L 27/14627* (2013.01)

(58) Field of Classification Search
 CPC .................. H04N 9/045; H04N 5/3696; H01L 27/14685; H01L 27/14621; H01L 27/14623; H01L 27/14627
 See application file for complete search history.

(56) References Cited

U.S. PATENT DOCUMENTS

| 6,829,008 | B1 | 12/2004 | Kondo et al. | |
| 7,612,811 | B2* | 11/2009 | Takeuchi | H01L 27/14621 348/272 |
| 8,611,738 | B2* | 12/2013 | Ishii | 396/124 |
| 2010/0308427 | A1* | 12/2010 | Lenchenkov | 257/432 |
| 2013/0107086 | A1* | 5/2013 | Nagano | 348/273 |

FOREIGN PATENT DOCUMENTS

| JP | 2000-156823 A | 6/2000 |
| JP | 2007-158597 A | 6/2007 |
| JP | 2008-270298 A | 11/2008 |
| JP | 2009-105358 A | 5/2009 |
| JP | 2011-081271 A | 4/2011 |

OTHER PUBLICATIONS

Hiroshi Takakusagi, U.S. Appl. No. 14/205,801, filed Mar. 12, 2014.
Hiroshi Takakusagi, U.S. Appl. No. 14/210,908, filed Mar. 14, 2014.

* cited by examiner

*Primary Examiner* — Twyler Haskins
*Assistant Examiner* — Padma Haliyur
(74) *Attorney, Agent, or Firm* — Fitzpatrick, Cella, Harper & Scinto

(57) ABSTRACT

A solid-state imaging apparatus, comprising a plurality of pixels respectively including photoelectric conversion portions arranged on a semiconductor substrate, wherein the plurality of pixels include pixels for imaging arranged according to a Bayer array and pixels for focus detection each having a light-shielding portion with an opening, and the opening of the light-shielding portion of a first pixel for focus detection arranged in a position where a red pixel of the Bayer array is to be arranged is made larger than that of a second pixel for focus detection arranged in a position where a blue pixel of the Bayer array is to be arranged.

11 Claims, 3 Drawing Sheets

SOLID-STATE IMAGING APPARATUS AND CAMERA

BACKGROUND OF THE INVENTION

1. Field of the Invention

The present invention relates to a solid-state imaging apparatus and camera.

2. Description of the Related Art

A solid-state imaging apparatus which includes a pixel for imaging and a pixel for focus detection each of which has a photoelectric conversion portion formed on a semiconductor substrate, can be used for an imaging system such as a digital camera. A color filter can be formed in the pixel for imaging according to, for example, a Bayer matrix.

Crosstalk can be generated when charges generated in a photoelectric conversion portion of a certain pixel enter an adjacent pixel. A crosstalk amount (amount of the charge entering the adjacent pixel) can depend on the amount of charge generated in the photoelectric conversion portion. For example, a red pixel undergoes photoelectric conversion in a position deeper from the semiconductor substrate surface than that of a blue pixel. In the case of forming a charge accumulation region of the photoelectric conversion portion on the semiconductor substrate surface, it may be difficult to collect charges generated in the deep position from the semiconductor substrate surface. The crosstalk amount from the red pixel to a green pixel can be larger than that from the blue pixel to the green pixel.

SUMMARY OF THE INVENTION

The present invention has been made in recognition of the above problem by the inventor, and provides a technique advantageous in improving the quality of an image to be obtained from a solid-state imaging apparatus including a pixel for imaging and pixel for focus detection.

One of the aspects of the present invention provides a solid-state imaging apparatus, comprising a plurality of pixels respectively including photoelectric conversion portions arranged on a semiconductor substrate, wherein the plurality of pixels include pixels for imaging arranged according to a Bayer array and pixels for focus detection each having a light-shielding portion with an opening, and the opening of the light-shielding portion of a first pixel for focus detection arranged in a position where a red pixel of the Bayer array is to be arranged is made larger than that of a second pixel for focus detection arranged in a position where a blue pixel of the Bayer array is to be arranged.

Further features of the present invention will become apparent from the following description of exemplary embodiments with reference to the attached drawings.

DESCRIPTION OF THE EMBODIMENTS (Reference Example)

Figure 1A:
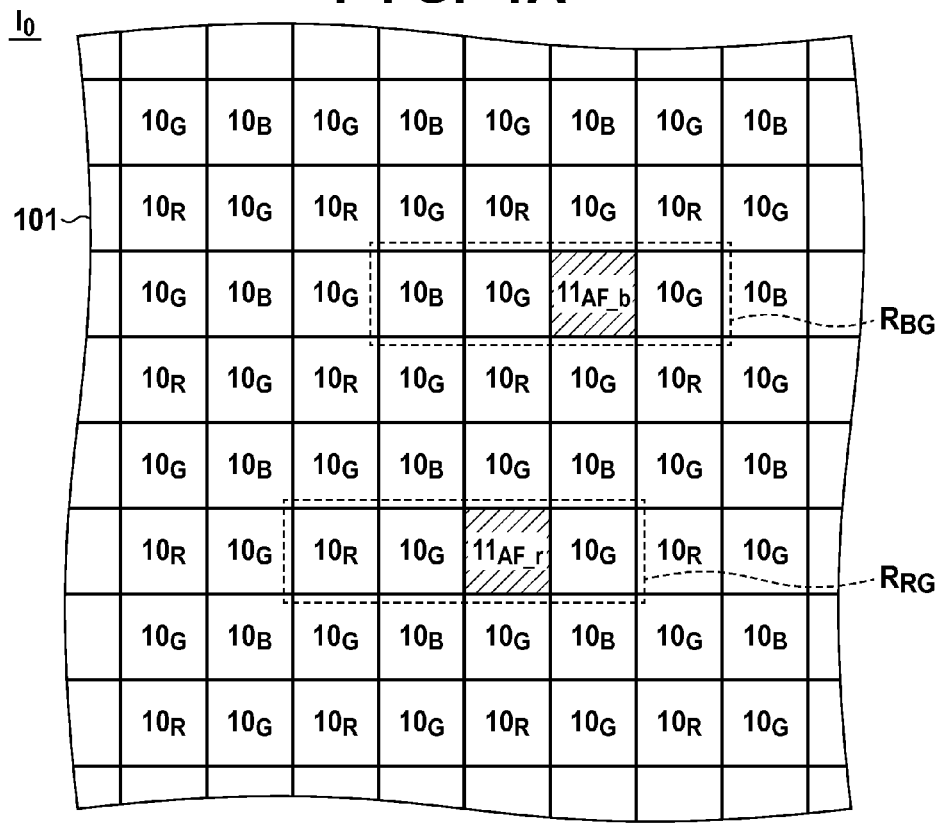
FIGS. 1A and 1B are views for explaining a reference example of a sectional structure of a solid-state imaging apparatus.

Before the description of each embodiment of the present invention, a solid-state imaging apparatus $I_D$ will be explained as a reference example with reference to FIGS. 1A and 1B. The solid-state imaging apparatus $I_D$ includes pixels 10 for imaging (including red pixels $10_R$, green pixels $10_G$, and blue pixels $10_B$) and pixels $11_{AF}$ for focus detection ("AF pixels $11_{AF}$" hereinafter) arranged on a single substrate 101 (semiconductor substrate). As shown in FIG. 1A, the red pixels $10_R$, green pixels $10_G$, and blue pixels $10_B$ are arranged in accordance with a Bayer array, and the AF pixels $11_{AF}$ are arranged, for example, in some of positions where the red pixels $10_R$ and blue pixels $10_B$ are to be arranged. Of the AF pixels $11_{AF}$, one arranged in a position where the red pixels $10_R$ are to be arranged is designated as an AF pixel $11_{AF\_r}$, and one arranged in a position where the blue pixels $10_B$ are to be arranged is designated as an AF pixel $11_{AF\_b}$. A region $R_{RG}$ indicates four pixels including the AF pixel $11_{AF\_r}$ of a row where the pixels 10 for imaging of the red pixels $10_R$ and green pixels $10_G$ are arranged. A region $R_{BG}$ shows four pixels including the AF pixel $11_{AF\_b}$ of a row where the pixels 10 for imaging of the blue pixels $10_B$ and green pixels $10_G$ are arranged.

Figure 1B:
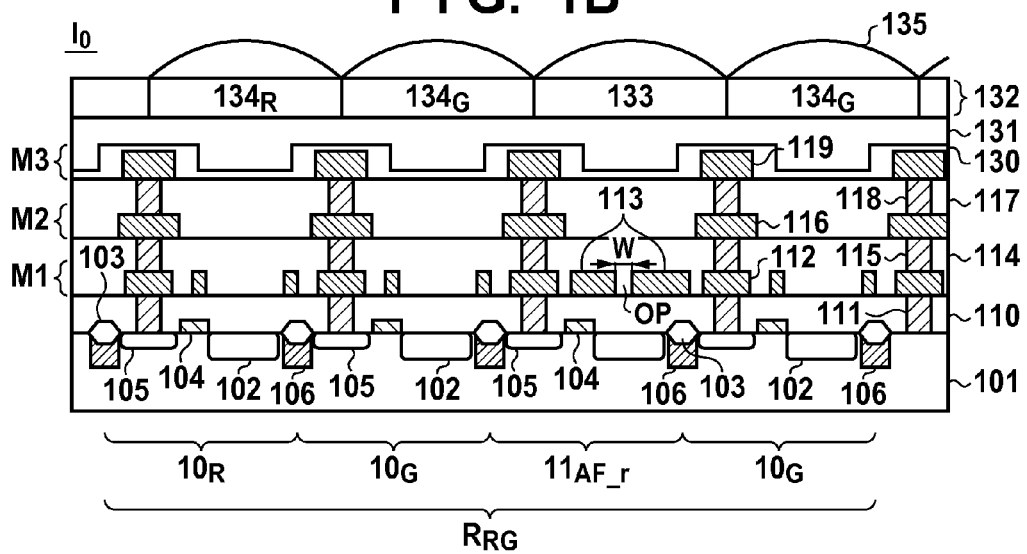

FIG. 1B exemplarily shows a sectional structure of the region $R_{RG}$ of a solid-state imaging apparatus $I_D$. In this reference example, although the region $R_{RG}$ is exemplified, the region $R_{BG}$ also has a similar structure. Photoelectric conversion portions 102 are formed on the substrate 101 in one-to-one correspondence with the pixels. Interlayer insulation layers (110, 114, 117), contact plugs (111, 115, 118), wiring patterns (112, 116, 119), a passivation film 130, a planarizing film 131, and microlenses 135 are formed on the substrate 101.

In each pixel 10 for imaging, a color filter 134 ($134_R$, $134_G$ or $134_B$) having a corresponding color can be arranged in a filter layer 132 between the photoelectric conversion portion 102 and the microlens 135. In the red pixel $10_R$, for example, the color filter $134_R$ for passing through red light is arranged. In the green pixel $10_G$, for example, the color filter $134_G$ for passing through green light is arranged. In the blue pixel $10_B$, for example, the color filter $134_B$ for passing through blue light is arranged.

Focus detection is performed based on, for example, a phase-difference detection method. A signal sufficient to perform focus detection need only be obtained from the AF pixel $11_{AF\_r}$, and the color filter 134 need not be formed in the AF pixel $11_{AF\_r}$. In this embodiment, a structure in which a light-transmitting colorless member 133 is formed in the AF pixel $11_{AF\_r}$ is exemplified. However, the present invention is not limited to this structure. For example, the AF pixel $11_{AF\_r}$ may also take a structure in which neither the color filter 134 nor the member 133 is arranged.

Each of the pixel 10 for imaging and AF pixel $11_{AF\_r}$ need only take a known circuit configuration, and can include, in addition to the photoelectric conversion portion 102, a plurality of transistors such as a transfer transistor and source follower transistor for reading out an electrical signal from the photoelectric conversion portion 102. When a control signal to be applied to the gate of the transfer transistor is activated, the transfer transistor transfers charges generated and accumulated in the photoelectric conversion portion 102 to the gate of the source follower transistor. Consequently, the potential of the gate changes, and the amount of electric current flowing through the source follower transistor can change in accordance with this potential change. Note that FIG. 1B specifically shows a gate electrode 104 of the transfer transistor, and a floating diffusion 105 (FD 105) as one diffusion region of the transfer transistor. The FD 105 is electrically connected to the gate of the above-described source follower transistor.

Also, each pixel 10 for imaging (or the AF pixel $11_{AF\_r}$) can further include, for example, a selection transistor as one of the plurality of transistors. When a control signal to be applied to the gate of the selection transistor is activated, the selection transistor can output a signal corresponding to the electric current amount of the source follower transistor. In addition, each pixel 10 for imaging (or the AF pixel $11_{AF\_r}$) can further include, for example, a reset transistor as one of the plurality of transistors. When a control signal to be applied to the gate of the reset transistor is activated, the reset transistor can reset the potential of the gate of the source follower transistor.

In the arrangement as described above, signals can be respectively read out from the pixels 10 for imaging (or the AF pixel $11_{AF\_r}$). Image data can be formed by inputting the signals read out from the pixels 10 for imaging to a processing unit (not shown) for performing signal processing such as image processing.

Focus detection can be performed by a phase-difference detection method based on light received by the AF pixel $11_{AF\_r}$. The AF pixel $11_{AF\_r}$ can take a structure in which a pattern 113 (a light-shielding portion with an opening) having an opening OP with a width W is formed in one of the wiring layers M1 to M3 (in this arrangement, the wiring layer M1), so as to perform pupil division. The opening OP is formed to shift from the center of the photoelectric conversion portion 102, and the pattern 113 limits light entering the photoelectric conversion portion 102. With this arrangement, a signal read out from each AF pixel $11_{AF}$ is input to, for example, a focus detection unit (not shown) for performing focus detection, and the lens position can be adjusted in accordance with the result of focus detection. The opening OP includes not only a circular opening but also a slit-shaped opening.

On the substrate 101, an element isolation portion 103 made of an insulator can be formed between the pixels. On the substrate 101, an element isolation region 106 can be formed between the pixels so as to prevent crosstalk that occurs due to the movement, between adjacent pixels, of a charge generated in each pixel. The element isolation region 106 can be so arranged as to surround the outer periphery of the photoelectric conversion portion 102 of each pixel.

The crosstalk amount between the red pixel $10_R$ and the green pixel $10_G$ is different from that between the AF pixel $11_{AF\_r}$ and the green pixel $10_G$. This is because the pattern 113 for taking a structure performing pupil division is formed in the AF pixel $11_{AF\_r}$, so the amount of light entering the photoelectric conversion portions 102 is smaller than that of the red pixels $10_R$. Since the amount of charge that moves to an adjacent pixel depends on the amount of generated charge, the amount of charge that moves to a green pixel $10_G$ adjacent to the AF pixel $11_{AF\_r}$ is smaller than that of charge that moves to the green pixel $10_G$ adjacent to the red pixel $10_R$. Note that crosstalk means charge entry to an adjacent pixel, and the amount of crosstalk means a charge amount to be entered in an adjacent pixel.

Although the region $R_{RG}$ has been described as an example in FIG. 1B, the same also applies to the region $R_{BG}$. That is, the crosstalk amount between the blue pixel $10_B$ and the green pixel $10_G$ is different from that between the AF pixel $11_{AF\_b}$ and the green pixel $10_G$. This is so because a depth to which light penetrates from the surface of the substrate 101 changes in accordance with the wavelength of the light. For example, light having entered the photoelectric conversion portion 102 of the AF pixels $11_{AF}$ causes photoelectric conversion in a position deeper from the surface of the substrate 101 than blue light, thereby generating a charge.

As described above, since the AF pixel $11_{AF}$ has a different structure from that of the pixel 10 for imaging, the crosstalk amount between the adjacent pixels varies when the AF pixel $11_{AF}$ is formed in one of positions where the pixels 10 for imaging are to be arranged. That is, in the solid-state imaging apparatus $I_D$ where the pixels 10 for imaging and AF pixels $11_{AF}$ are arranged to form a pixel array, the crosstalk amount in the region where the AF pixel $11_{AF}$ is arranged differs from that in other regions. This, for example, results in image data having a singular signal value according to the arrangement of the AF pixels $11_{AF}$. This can deteriorate the quality of an image to be obtained by the solid-state imaging apparatus $I_D$. Hence, it is desirable that the influence on the crosstalk between the adjacent pixels due to formation of the AF pixel $11_{AF}$ is small.

(Configuration Example of Present Invention)

Figure 2A:
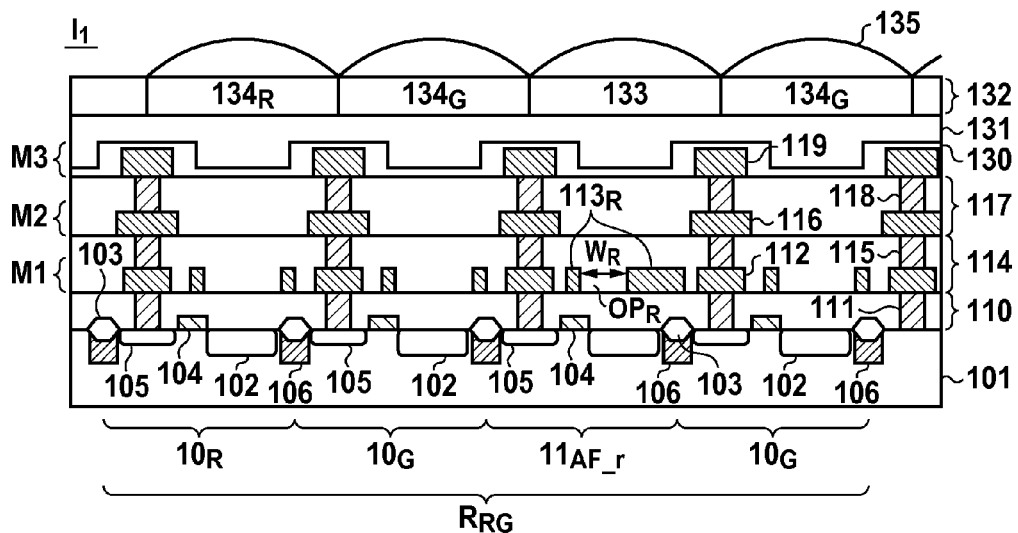
FIGS. 2A and 2B are views for explaining the sectional structure of the solid-state imaging apparatus according to the present invention.
Figure 2B:
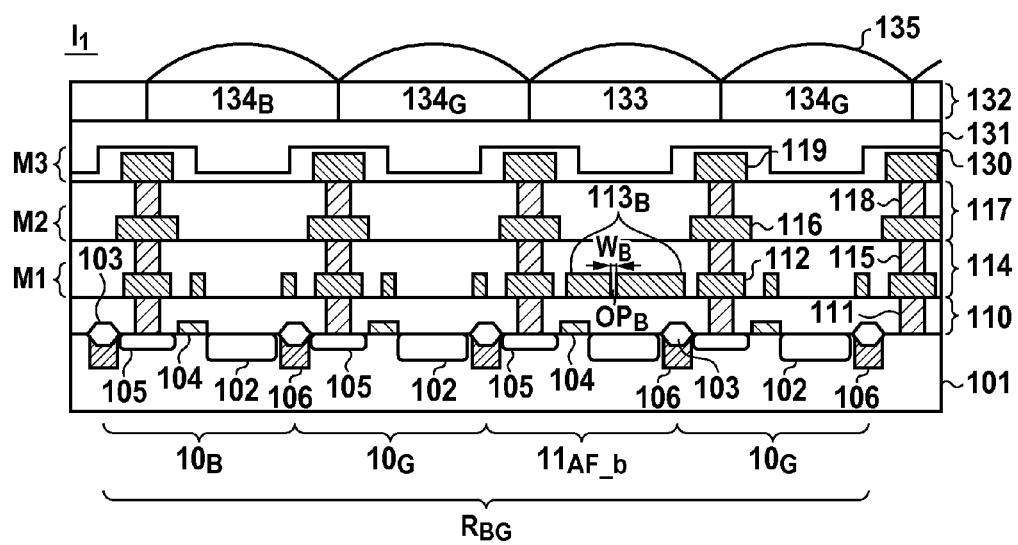

FIGS. 2A and 2B schematically show the sectional structure of the solid-state imaging apparatus $I_1$ as a configuration example of the present invention. FIG. 2A shows the structure in the region $R_{RG}$, and FIG. 2B shows the structure in the region $R_{BG}$. The solid-state imaging apparatus $I_1$ differs from the solid-state imaging apparatus $I_D$ of the reference example in that the AF pixel $11_{AF\_r}$ and AF pixel $11_{AF\_b}$ have different widths W of the openings OP of the patterns 113.

The area of the opening $OP_R$ of the pattern $113_R$ in the AF pixel $11_{AF\_r}$ is larger than that of an opening $OP_B$ of the pattern $113_B$ in the AF pixel $11_{AF\_b}$. The patterns $113_R$ and $113_B$ may be formed so that a width $W_R$ of the opening $OP_R$ is made larger than a width $W_B$ of the opening $OP_B$. Because of this, the charge amount generated in the photoelectric conversion portions 102 in the AF pixel $11_{AF\_r}$ becomes larger than that in the AF pixel $11_{AF\_b}$. That is, the magnitude relationship between the AF pixel $11_{AF\_r}$ and the AF pixel $11_{AF\_b}$ for the charge amount generated in the photoelectric conversion portions 102 is similar to that between the red pixels $10_R$ and the blue pixels $10_B$. Therefore, according to the configuration example of the present invention, it is possible to reduce the influence on the crosstalk between the adjacent pixels due to formation of the AF pixel $11_{AF}$ in the case of the above-described solid-state imaging apparatus $I_D$ (reference example).

In particular, the pixels 10 for imaging and AF pixels $11_{AF}$ may be formed so that the charge amount generated in the photoelectric conversion portions 102 equals between the AF pixel $11_{AF\_r}$ and the red pixel $10_R$, as well as between the AF pixel $11_{AF\_b}$ and the blue pixel $10_B$. For example, the wiring patterns for power supply or signal transmission are arranged in a peripheral region of the pixels 10 for imaging, and the opening is formed by the wiring pattern so that a mixture of colors between adjacent pixels is prevented. The area of the opening $OP_R$ of the pattern $113_R$ may be, for example, within the range of 37% or more to less than 74% of that of the opening the red pixel $10_R$ has. The area of the opening $OP_B$ of the pattern $113_B$ may be, for example, within the range of 5% or more to less than 37% of that of the opening the blue pixel $10_B$ has. Note that although not shown here, respective pixels may be formed so that the charge amount generated in the photoelectric conversion portions 102 equals between the AF pixel $11_{AF}$ and the green pixel $10_G$ when, for example, the AF pixel $11_{AF}$ is formed in the position where the green pixel $10_G$ is to be arranged.

In the above-described arrangement, it is possible to reduce the influence on the crosstalk between the adjacent pixels due to formation of the AF pixel $11_{AF}$. Consequently, the quality of an image to be obtained by the solid-state imaging apparatus $I_1$ can improve.

(Manufacturing Method)

Figure 3A:
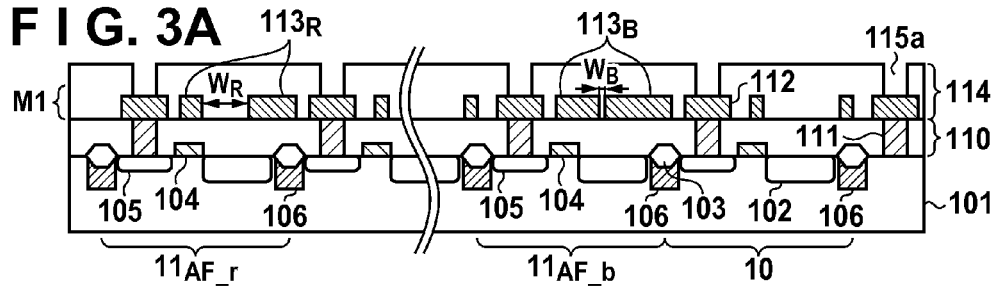
FIGS. 3A to 3D are views for explaining a manufacturing method of the solid-state imaging apparatus according to the present invention.

An example of a method of manufacturing the above-described solid-state imaging apparatus $I_1$ will be described below with reference to FIGS. 3A to 3D. FIGS. 3A to 3D illustrate the AF pixels $11_{AF}$ ($11_{AF\_r}$ and $11_{AF\_b}$), as well as a region including the pixels 10 for imaging. First, as shown in FIG. 3A, the substrate 101 having a semiconductor region such as p-type silicon is prepared, and the element isolation portion 103 can be formed on the surface of the substrate 101 by, for example, LOCOS. Then, a photoresist pattern is formed on the substrate 101, and a p-type impurity is implanted below the element isolation portion 103 by, for example, ion implantation, thereby forming the element isolation region 106.

After that, the gate electrodes (in this example, the gate electrodes 104) of various transistors (for example, a transfer transistor and source follower transistor) and n-type diffusion regions (in this example, the photoelectric conversion portion 102 and FD 105) are formed by using a well-known semiconductor process. Note that although not shown in FIG. 3A, a gate insulating film of each transistor and native oxide film can be formed on the surface of the substrate 101.

Subsequently, the first interlayer insulation film 110 made of an insulating material such as silicon oxide is formed by, for example, CVD (Chemical Vapor Deposition) on the substrate 101 so as to cover the gate electrodes 104 and the like. After that, the upper surface of the interlayer insulation film 110 is planarized by, for example, CMP (Chemical Mechanical Polishing).

Then, the contact plug 111 is formed. The contact plug 111 connects the substrate 101 and the gate electrode and the like to the wiring pattern 112 to be formed in a first wiring layer M1 later. Then, a metal film mainly containing an element such as Al, Mo, W, Ta, Ti, TiN, or Cu, or any of these elements, or a multilayered film of any of these elements is formed on the interlayer insulation film 110 by, for example, sputtering, CVD, or electroplating. After that, the wiring pattern 112, and the pattern $113_R$ and $113_B$ are formed in the first wiring layer M1 through a lithography step and etching step. As described above, the patterns $113_R$ and $113_B$ are formed so that the width $W_R$ of the opening $OP_R$ is made larger than the width $W_B$ of the opening $OP_B$.

Then, the second interlayer insulation film 114 is formed on the first wiring layer M1 so as to cover the pattern $113_R$ and $113_B$ and the wiring pattern 112, following the same procedures as for the interlayer insulation film 110. The upper surface of the second interlayer insulation film 114 can be planarized by CMP or the like. After that, an opening $115a$ for the contact plug 115 is formed. The contact plug 115 connects the wiring pattern 112 of the first wiring layer M1 to the wiring pattern 116 to be formed in a second wiring layer M2 later.

Figure 3B:
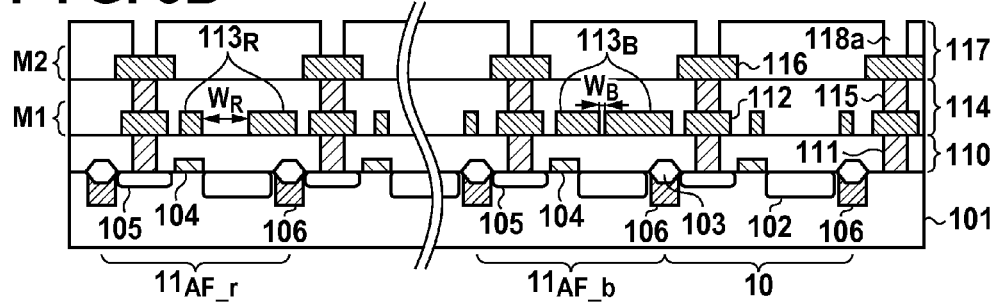

Then, as shown in FIG. 3B, a metal member containing an element such as Al, Mo, W, Ta, Ti, TiN, or Cu or mainly any of these elements is embedded in the opening $115a$ by, for example, sputtering, CVD, or electroplating. Further, this metal member is planarized by CMP, etchback, or the like, and the contact plug 115 is formed. Then, the wiring pattern 116 is formed in the second wiring layer M2 following the same procedures as for the wiring pattern 112 and pattern 113. Furthermore, following the same procedures as for the interlayer insulation film 114, the third interlayer insulation layer 117 is formed on the second wiring layer M2 so as to cover the wiring pattern 116, and the upper surface of the third interlayer insulation layer 117 is planarized by CMP or the like. After that, following the same procedures as for the opening $115a$, an opening $118a$ for the contact plug 118 is formed. The contact plug 118 connects the wiring pattern 116 of the second wiring layer M2 to the wiring pattern 119 to be formed in a third wiring layer M3 later.

Figure 3C:
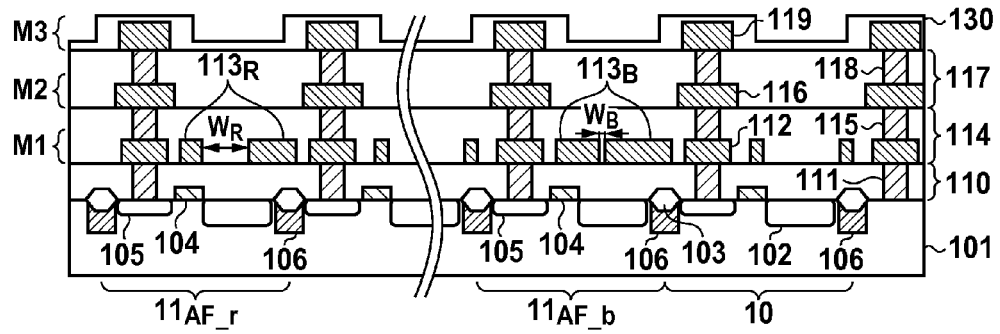

Subsequently, as shown in FIG. 3C, following the same procedures as for the contact plug 115, the metal member is embedded in the opening $118a$, and the contact plug 118 is formed. In addition, the wiring pattern 119 is formed in the third wiring layer M3 following the same procedures as for the wiring pattern 116. After that, the passivation film 130 made of an inorganic material is formed on the interlayer insulation film 117 so as to cover the wiring pattern 119.

Figure 3D:
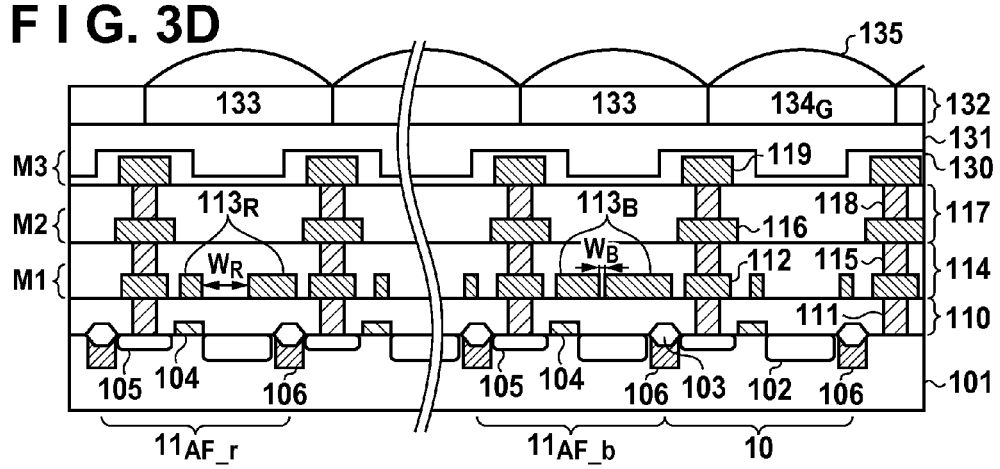

Then, as shown in FIG. 3D, the planarization layer 131 made of an organic material can be formed on the passivation film 130 by, for example, a coating method. After that, the filter layer 132 is formed on the planarization layer 131, and the color filter 134 or the light-transmitting colorless member 133 is formed for each pixel 10 for imaging or each AF pixel 11AF. Finally, the microlenses 135 can be formed on a planarization layer (not shown) formed on the filter layer 132 in one-to-one correspondence with the pixels 10 for imaging or the AF pixels $11_{AF}$ through a predetermined patterning/reflow process. The member 133 may also be a member integrated with the planarization layer formed on the filter layer 132.

By the manufacturing method described above, the solid-state imaging apparatus $I_1$ which includes the pixels 10 for imaging and the AF pixels $11_{AF}$ arranged on the single substrate 101, and is advantageous in improving the quality of an image is obtained.

Note that the element isolation region 106 between respective pixels formed on the substrate 101 can reduce the crosstalk between the adjacent pixels. As the number of pixels increases (as the size of each pixel decreases), however, it has become necessary to increase the photoelectric conversion efficiency of the photoelectric conversion portion and decrease the area of the element isolation region 106 at the same time. Therefore, it is not easy to cancel the crosstalk by making a barrier against the charge of the element isolation region 106 (potential barrier) higher (by raising the ability to prevent the movement of the charge). Another arrangement can be considered to reduce and uniformize the difference between the above-described crosstalk amounts by adjusting the barrier against the charge of the element isolation region 106 between the adjacent pixels 10 for imaging, and between the pixels 10 for imaging and the AF pixels $11_{AF}$. However, in order to form this arrangement, a step of performing impurity implantation in the substrate 101 twice or more and a step of adjusting the film thickness of a resist used when performing impurity implantation per pixel by etching or the like are required, thus it is not easy in terms of manufacturing.

On the other hand, according to the present invention, the element isolation region 106 can be formed so as to uniformize the barrier against the charge between respective pixels, which is advantageous in terms of manufacturing. That is, of the element isolation regions 106 formed between respective pixels on the substrate 101, the first portion between the pixels 10 for imaging adjacent to each other and the second part between the pixel 10 for imaging and the AF pixel $11_{AF}$ can be formed to have an equal barrier against the charge. More specifically, the first part and the second part can be formed to have the same depth from the surface of the substrate 101, the same width between pixels, and the same impurity concentration.

Also, in the solid-state imaging apparatus $I_1$, output values of the pixel signals for focus detection can be different because the width $W_R$ of the opening $OP_R$ and the width $W_B$ of the opening $OP_B$ in the AF pixel $11_{AF\_r}$ and the AF pixel $11_{AF\_b}$ are different. Therefore, a signal amplification unit for amplifying a signal from the AF pixel $11_{AF}$ at an amplification factor corresponding to the position of the AF pixel $11_{AF}$ can be formed in a signal processing unit of the solid-state imaging apparatus $I_1$. For example, the signal amplification unit can be formed so as to make the amplification factor for the signal from the AF pixel $11_{AF\_b}$ higher than that from the AF pixel $11_{AF\_r}$.

In the above-described arrangement, the arrangement in a Bayer array has been described. However, the arrangement is not limited to the Bayer array. In addition, the layout of the pixels for focus detection is not limited to the above-described one. Furthermore, the signal from the pixel for focus detection can be used for image formation (can also be used for imaging in addition to focus detection). The present invention is not limited to the above-described arrangement, and can be changed in accordance with the purpose, state, application, function, and other specifications, that is, can be carried out by another embodiment.

(Imaging System)

In the above embodiment, the solid-state imaging apparatus included in an imaging system such as a camera has been described. The concept of the imaging system includes not only an apparatus whose main purpose is imaging, but also an apparatus (for example, a personal computer or portable terminal) having an imaging function as an auxiliary function. The imaging system can include the solid-state imaging apparatus according to the present invention exemplified as the above-mentioned embodiment, and a processing unit that processes an output signal from this solid-state imaging apparatus. This processing unit, for example, can include an A/D converter, and a processor that processes digital data output from this A/D converter. Focus detection processing may be performed by this processing unit, or an arrangement in which a calculation unit for performing the focus detection processing is provided separately may be employed. Any changes can be made appropriately.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-097112, filed May 2, 2013, which is hereby incorporated by reference herein in its entirety.

What is claimed is:

1. A solid-state imaging apparatus comprising a plurality of pixels each including a light-shielding portion with an opening and a photoelectric conversion portion arranged on a semiconductor substrate,
   wherein the plurality of pixels are arranged according to a Bayer array and include imaging pixels used for imaging and focus detection pixels used for focus detection,
   the imaging pixels include a first imaging pixel arranged in a red position of the Bayer array and a second imaging pixel arranged in a blue position of the Bayer array,
   the focus detection pixels include a first focus detection pixel arranged in a red position of the Bayer array and a second focus detection pixel arranged in a blue position of the Bayer array,
   an opening of a light-shielding portion of the first focus detection pixel is smaller than an opening of a light-shielding portion of the first imaging pixel,
   an opening of a light-shielding portion of the second focus detection pixel is smaller than an opening of a light-shielding portion of the second imaging pixel, and
   an opening of a light-shielding portion of the first focus detection pixel is larger than an opening of a light-shielding portion of the second focus detection pixel.

2. The apparatus according to claim 1, wherein an area of the opening of the light-shielding portion of the first focus detection pixel falls within a range of not less than 37% to less than 74% of that of the first imaging pixel.

3. The apparatus according to claim 1, wherein an area of the opening of the light-shielding portion of the second focus detection pixel falls within a range of not less than 5% to less than 37% of that of the second imaging pixel.

4. The apparatus according to claim 1, wherein a plurality of wiring layers are formed over the semiconductor substrate, and the light-shielding portion is formed in a wiring layer closest to the semiconductor substrate among the plurality of wiring layers.

5. The apparatus according to claim 1, further comprising a signal amplification unit configured to amplify a signal from the focus detection pixel at an amplification factor based on a color corresponding to the position of the focus detection pixel in the Bayer array.

6. A camera comprising:
   a solid-state imaging apparatus comprising a plurality of pixels each including a light-shielding portion with an opening and a photoelectric conversion portion arranged on a semiconductor substrate, wherein the plurality of pixels are arranged according to a Bayer array and include imaging pixels used for imaging and focus detection pixels used for focus detection, the imaging pixels include a first imaging pixel arranged in a red position of the Bayer array and a second imaging pixel arranged in a blue position of the Bayer array, the focus detection pixels include a first focus detection pixel arranged in a red position of the Bayer array and a second focus detection pixel arranged in a blue position of the Bayer array, an opening of a light-shielding portion of the first focus detection pixel is smaller than an opening of a light-shielding portion of the first imaging pixel, an opening of a light-shielding portion of the second focus detection pixel is smaller than an opening of a light-shielding portion of the second imaging pixel, and an opening of a light-shielding portion of the first focus detection pixel is larger than an opening of the second focus detection pixel; and
   a processing unit configured to process a signal from the solid-state imaging apparatus.

7. A solid-state imaging apparatus comprising a plurality of pixels respectively including photoelectric conversion portions arranged on a semiconductor substrate,
   wherein the plurality of pixels include imaging pixels used for imaging and respectively having color filters arranged according to a Bayer array, and a focus detection pixel used for focus detection, having a light-shielding portion with an opening, arranged in a position corresponding to a first color of the Bayer array, and receiving light from a wider range of wavelengths than a range of wavelengths of light received by pixels of the first color,
   an opening of a light-shielding portion of the focus detection pixel is smaller than a light-receiving opening of an imaging pixel which has a color filter for passing through light of the first color, and
   the opening of the light-shielding portion of the focus detection pixel is formed so that the focus detection pixel and the imaging pixel which has the color filter for passing through light of the first color have equal charge amounts generated by incident light in the photoelectric conversion portions.

8. The apparatus according to claim 7, wherein a plurality of wiring layers are formed over the semiconductor substrate, and the light-shielding portion is formed in a wiring layer closest to the semiconductor substrate among the plurality of wiring layers.

9. The apparatus according to claim 7, further comprising a signal amplification unit configured to amplify a signal from the focus detection pixel at an amplification factor based on the first color.

10. A camera comprising:
a solid-state imaging apparatus comprising a plurality of pixels respectively including photoelectric conversion portions arranged on a semiconductor substrate, wherein the plurality of pixels include imaging pixels used for imaging and respectively having color filters arranged according to a Bayer array, and a focus detection pixel used for focus detection, having a light-shielding portion with an opening, arranged in a position corresponding to a first color of the Bayer array, and receiving light from a wider range of wavelengths than a range of wavelengths of light received by pixels of the first color, an opening of a light-shielding portion of the focus detection pixel is smaller than a light-receiving opening of an imaging pixel which has a color filter for passing through light of the first color, and the opening of the light-shielding portion of the focus detection pixel is formed so that the focus detection pixel and the imaging pixel which has the color filter for passing through light of the first color have equal charge amounts generated by incident light in the photoelectric conversion portions; and
a processing unit configured to process a signal from the solid-state imaging apparatus.

11. The apparatus according to claim 1, wherein an opening of a light-shielding portion of the first imaging detection pixel is substantially the same size as an opening of a light-shielding portion of the second imaging pixel.

* * * * *